United States Patent
Shibahara et al.

(10) Patent No.: US 6,297,642 B1
(45) Date of Patent: Oct. 2, 2001

(54) PARTIAL DISCHARGE DETECTION METHOD

(75) Inventors: Kazuhito Shibahara, Kyoto; Masahiro Sumiyoshi; Yoshihiro Watanabe, both of Toyama, all of (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/309,605

(22) Filed: May 11, 1999

(30) Foreign Application Priority Data

May 12, 1998 (JP) .................................. 10-148452

(51) Int. Cl.[7] .............................. G01R 31/12; H01H 9/50
(52) U.S. Cl. ...................... 324/536; 324/510; 324/511; 324/551
(58) Field of Search ..................... 324/509, 510, 324/511, 520, 536, 551, 457, 122

(56) References Cited

U.S. PATENT DOCUMENTS

| | | | |
|---|---|---|---|
| 4,775,839 | * 10/1988 | Kosina et al. | 324/536 |
| 5,706,159 | * 1/1998 | Dollar, II et al. | 324/536 X |
| 5,831,538 | * 11/1998 | Schena | 324/536 X |
| 5,854,556 | * 12/1998 | Steenis et al. | 324/536 |
| 5,903,220 | * 5/1999 | Jon et al. | 324/457 X |

FOREIGN PATENT DOCUMENTS 8-160893    6/1996   (JP) .

* cited by examiner

Primary Examiner—Glenn W. Brown
(74) Attorney, Agent, or Firm—Finnegan, Henderson, Farabow, Garrett & Dunner, L.L.P.

(57) ABSTRACT

An electromagnetic waveform developing in synchronism with a system power supply by a partial discharge of electric equipment such as a power distribution device is received by an antenna 1. From the electromagnetic waveform of measurement frequency included in the received signal, there are extracted a component changing according to the frequency of the system power supply and a component changing at the frequency twice that of the system power supply. The presence or absence of discharge is determined from the magnitude of each of the extracted components, thereby detecting a partial discharge.

12 Claims, 9 Drawing Sheets

PARTIAL DISCHARGE DETECTION METHOD

BACKGROUND OF THE INVENTION

1. Field of the Invention

The present invention relates to a partial discharge detection method which enables non-contact detection of insulation deterioration in electric equipment by non-contact detection of a partial discharge arising from electric equipment, such as power distribution equipment, by means of the electromagnetic waveform generated by the discharge.

2. Description of the Related Art

In electric equipment primarily receiving a high voltage, such as pole-type equipment (an insulator or a potential transformer) provided in a power distribution line, e.g., power distribution equipment (distribution hardware) or a motor, so-called partial discharge stems from insulation deterioration, thus resulting in a high-frequency, wide-range electromagnetic waveform (i.e., high-frequency noise).

The partial discharge of this type is synchronous with a system power supply and generally arises in the positive and negative electrodes of a system power supply, and a resultant frequency becomes twice that of the system power supply.

Because of this, the electromagnetic wave usually changes in magnitude at a frequency twice as high as that of the system power supply.

For this reason, the applicants of the present invention have already invented a partial discharge detection method (filed as Japanese Patent Application No. Hei.8-160893). In this method, there is extracted a component changing at a frequency twice that of a system power supply of a received electromagnetic waveform of a preset measurement frequency. A partial discharge arising from electric equipment having deteriorated insulation is detected from the magnitude of the component or from a ratio of the magnitude of the component to the magnitude of background noise.

In case of the partial discharge detection method as described above, a partial discharge is detected by extraction of a component of an electromagnetic waveform changing at a frequency twice that of system power supply based on a partial discharge. Accordingly, as a result of a change in the environment or discharging state of a discharging portion of electric equipment having deteriorated insulation, a partial discharge arises only in the positive or negative electrode of the system voltage. When the electromagnetic waveform generated by electric discharge changes in magnitude in synchronism with the system power supply, a partial discharge cannot be detected.

More specifically, in a case where the electromagnetic waveform generated by a partial discharge changes in magnitude at the frequency of the system power supply, if a component changing at the frequency is extracted as a component changing at twice the frequency, the magnitude of the extracted component (i.e., an effective value) becomes smaller than the value of the component extracted as changing at the frequency of the system power supply. Consequently, a partial discharge cannot be detected, thus causing detection failures.

SUMMARY OF THE INVENTION

It is an object of the present invention to reliably detect a partial discharge arising from electric equipment having deteriorated insulation, on the basis of a frequency component of a system power supply of a received electromagnetic waveform of a measurement frequency.

It is another object of the present invention to reliably detect a partial discharge even when an electromagnetic waveform generated by the partial discharge changes at the frequency of a system power supply or at a frequency twice that of the system power supply.

A partial discharge detection method according to the present invention comprises the steps of: receiving an electromagnetic waveform which is generated by a partial discharge of electric equipment in synchronism with a system power supply; extracting a component changing at the frequency of the system power supply from the electronic waveform of measurement frequency included in the received signal; and detecting a partial discharge by determining the presence or absence of partial discharge based on the extracted component.

DETAILED DESCRIPTION OF THE INVENTION

Figure 1:
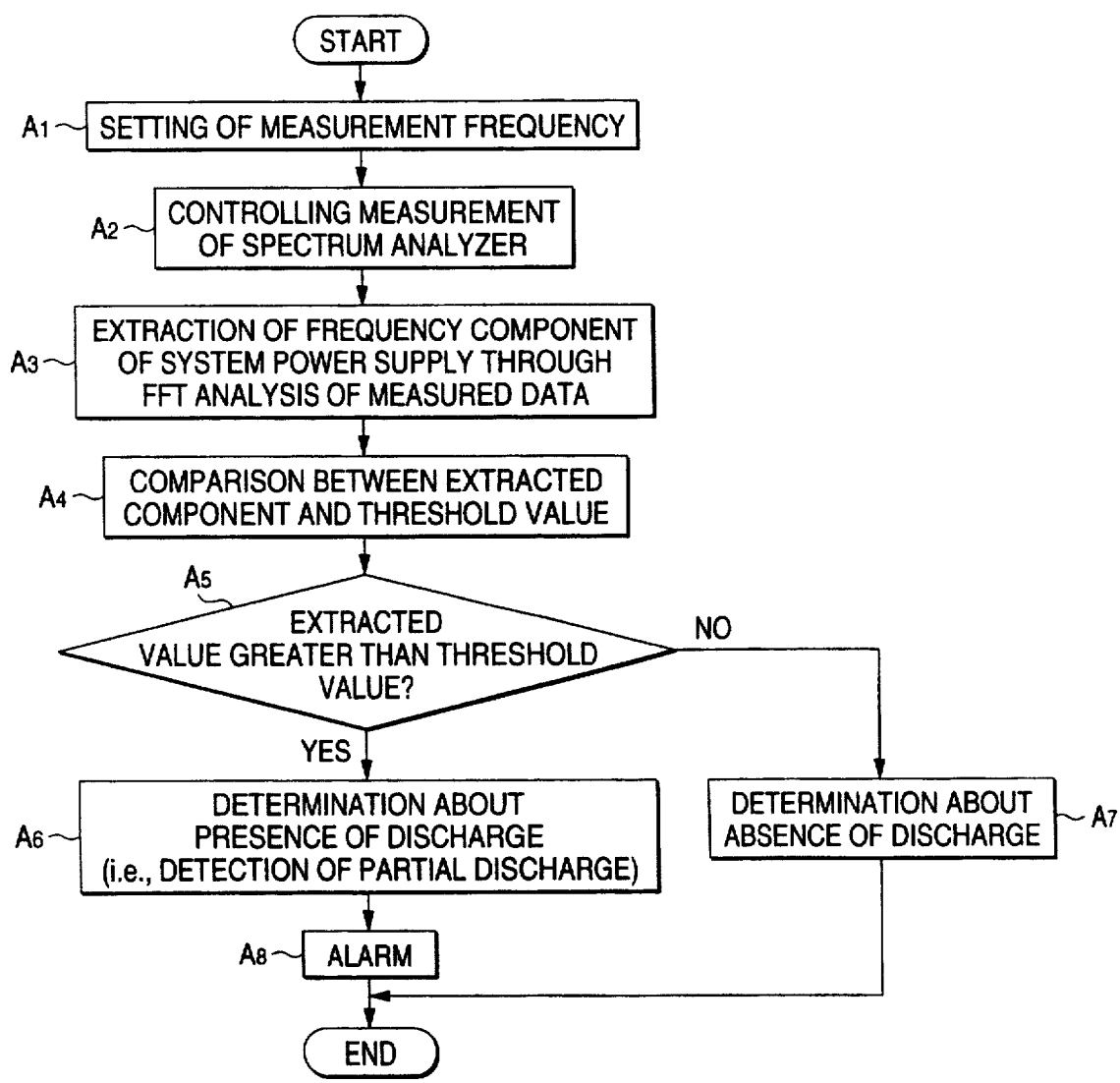
FIG. 1 is a flowchart for describing detection processing according to a first embodiment of the present invention.

Detailed description of the present invention will be described as follows.

In a partial discharge detection method according to a first aspect of the present invention, an antenna receives an electromagnetic waveform which is generated by a partial discharge of electric equipment, such as power distribution equipment, in synchronism with a system power supply. A component changing at the frequency of the system power supply is extracted from the electronic waveform of measurement frequency included in the signal received by the antenna. A partial discharge is detected by determining the presence or absence of partial discharge based on the magnitude of the extracted component.

Accordingly, when a received electromagnetic waveform of measurement frequency is generated by partial discharge in synchronism with a system power supply, and the electromagnetic waveform changes in magnitude a the frequency of the system power supply, a component having the frequency of the system power supply is extracted from the electromagnetic waveform.

Provided that the extracted component is a component having the frequency of the system power supply, a partial discharge is reliably detected from the magnitude of the component without fail.

According to a second aspect of the present invention, there is extracted a component changing at the frequency of the system power supply from the electromagnetic waveform of measurement frequency included in the signal received by the antenna, and a partial discharge is detected by determination as to whether or not there is discharge, on the basis of a strength ratio of the extracted component to the background noise of the signal received by the antenna.

Accordingly, when the received electromagnetic waveform includes background noise such as broadcast waveform, the ratio of the signal received by the antenna to background noise is obtained, the component changing at the frequency of the system power supply is extracted from the electromagnetic waveform of measurement frequency by exclusion of background noise.

As a result, when the electromagnetic waveform of measurement frequency changes at the frequency of system power supply by means of partial discharge, the partial discharge can be reliably detected without fail by elimination of influence of background noise.

According to a third aspect of the present invention, there is extracted a component changing at the frequency of power supply from the electronic waveform of measurement frequency included in the signal received by the antenna. When at least either the magnitude of the extracted component or a strength ratio of the extracted component to the background noise of the received signal shows the existence of discharge, a partial discharge is detected.

As a result, the presence or absence of discharge is determined from the magnitude of the component of the received electromagnetic waveform of measurement frequency changing at the frequency of system power supply. Further, the presence or absence of discharge is determined from the strength ratio of the component to background noise. When at least either the magnitude of the component or the ratio shows the existence of discharge, a partial discharge is detected.

In comparison with the detection method according to the first and second aspects, a partial discharge can be more reliably detected from the component of the electromagnetic waveform of measurement frequency changing at the frequency of system power supply.

According to a fourth aspect of the present invention, an antenna receives an electromagnetic waveform that has been generated by a partial discharge of an electric device of power distribution equipment in synchronism with the system power supply. From the electromagnetic waveform of measurement frequency included in the signal received by the antenna, there are extracted a first component changing at the frequency of system power supply and a second component changing at the frequency which is twice that of the system power supply. The presence or absence of discharge is determined from the magnitude of each of the first and second components. A partial discharge is detected when the result of at least determination is either the first component or the second component shows the existence of discharge.

Accordingly, a partial discharge can be reliably detected from the magnitude of a frequency component not only when the received electromagnetic waveform of measurement frequency is changed at the frequency of system power supply by means of partial discharge but also when the electromagnetic waveform changes at the frequency which is twice that of the system power supply.

According to a fifth aspect of the present invention, a first component changing at the frequency of system power supply and a second component changing at a frequency twice that of system power supply are extracted from the electromagnetic waveform of measurement frequency included in the signal received by the antenna. The presence or absence of discharge is determined from the sum of the two components.

Accordingly, when the received electromagnetic waveform of measurement frequency is changed by a partial discharge and where the electromagnetic waveform changes at the frequency which is twice that of system power supply, a partial discharge is detected from the sum of the extracted components of the two frequencies.

According to a sixth aspect of the present invention, a first component changing at the frequency of system power supply and a second component changing at a frequency which is twice that of system power supply are extracted from the electromagnetic waveform of measurement frequency included in the signal received by the antenna. The presence or absence of a partial discharge is determined from a strength ratio of the first component to the background noise of the received signal and from the strength ratio of the second component to the background noise of the received signal. In a case where at least either one of the results of such determination shows the existence of discharge, a partial discharge is detected.

Accordingly, when the electromagnetic waveform of measurement frequency is changed by means of a partial discharge at the frequency of system power supply and at the frequency which is twice that of system power supply, the partial discharge is detected from the strength ratio of the first component to background noise and from the strength ratio of the second component to background noise.

According to a seventh aspect of the present invention, a first component changing at the frequency of system power supply and a second component changing at a frequency which is twice that of system power supply are extracted from the electromagnetic waveform of measurement frequency included in the signal received by the antenna. The presence or absence of discharge is determined from the magnitude of one of the components or from the sum of magnitudes of the two components. The presence or absence of a partial discharge is determined from a strength ratio of the first and second components to the background noise of the received signals or a strength ratio of the sum of the first and second components to the background noise. When at least one of the results of such determination shows the existence of discharge, a partial discharge is detected.

Accordingly, when a received electromagnetic waveform of measurement frequency changes at the frequency of system power supply and where the electromagnetic waveform changes at the frequency which is twice that of system power supply, a partial discharge is detected with considerably high accuracy from the magnitude of the extracted component and a strength ratio of the extracted component to background noise, by combination of the detection method in the fourth and fifth aspects with the detection method in the sixth aspect.

In each of the first to seventh aspects, a partial discharge is actually detected from electromagnetic energy, and hence the extracted component or the first and second components can be more realistically expected to assume an effective value or values.

Preferred embodiments of the present invention will be described by reference to FIGS. 1 through 11.

(First Embodiment)

Figure 2:
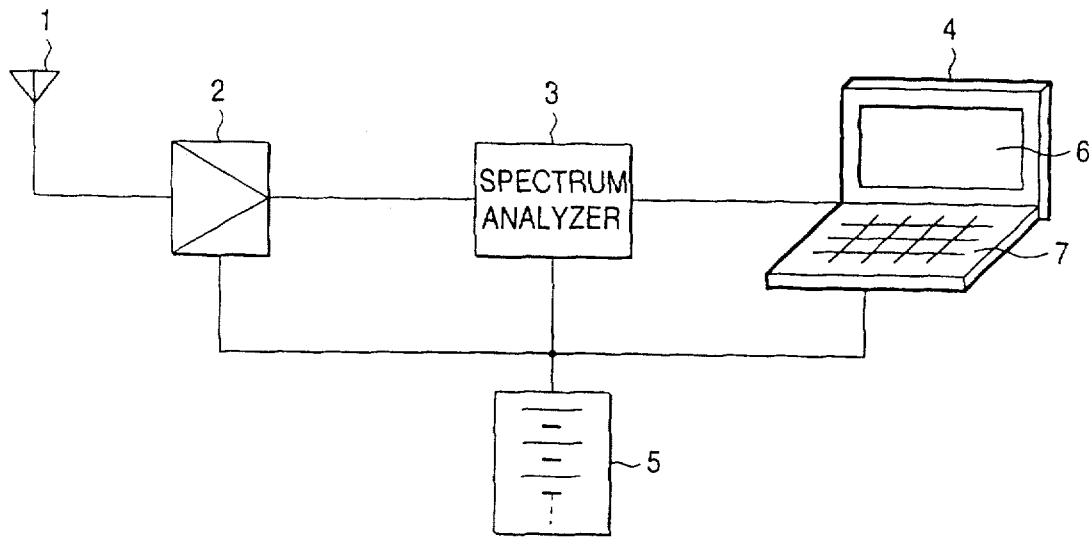
FIG. 2 is a block diagram showing a device used for the detection processing shown in FIG. 1.

FIG. 2 shows the configuration of a system used for detecting a partial discharge. A signal having a broadband of 0 to 200 MHz or thereabouts is supplied to a spectrum analyzer 3 through a pre-amplifier 2.

Measurement conditions of the spectrum analyzer 3 are set by way of a keyboard of a so-called portable personal computer 4 located subsequent to the spectrum analyzer 3. Measured data are supplied to the computer 4.

The computer 4, together with the spectrum analyzer 3, constitutes component extraction unit. A partial discharge is detected from the result of such extraction performed by the component extraction unit.

In the first embodiment, a plurality of pole-type devices provided in a power distribution path are handled as electric equipment to be detected and are subjected to so-called movement measurement. To this end, an antenna 1, the pre-amplifier 2, the spectrum analyzer 3, and the computer 4 are mounted on a vehicle and are actuated by a battery 5.

Figure 3:
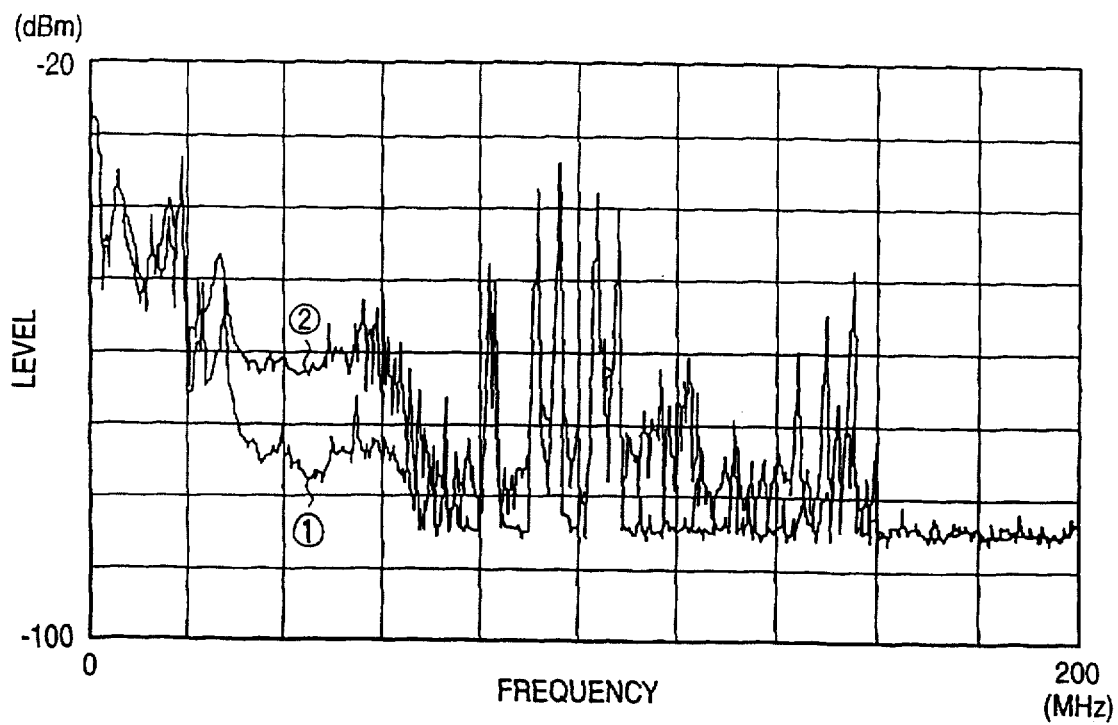
FIG. 3 is one example of a graph showing the frequency characteristics of a signal received by the antenna shown in FIG. 2.

When measurement is commenced in the vicinity of pole-type equipment of an electric pole, the antenna 1 receives a signal having the frequency characteristics such as those denoted by e.g., solid line (1) shown in FIG. 3, unless partial discharge develops in the equipment. In contrast, if there is a partial discharge, the antenna receives a signal having the frequency characteristics such as those denoted by, e.g., solid line (2) shown in FIG. 3.

FIG. 3 shows frequency characteristics of 0 to 200 MHz. Solid line (1) denotes the characteristics measured at an electric pole having no problems and solid line (2) denotes the characteristics measured at an electric pole from which a partial discharge of about 5000 pC(pico Coulomb) develops.

The characteristics denoted by solid line (1) correspond to the characteristics of background noise (BGN) obtained in the environment where noise radio waves are measured, and the characteristics denoted by solid line (2) correspond to the characteristics of background noise on which an electromagnetic waveform generated by partial discharge is superimposed.

The electromagnetic waveform generated by partial discharge develops in synchronism with system power supply, and the magnitude of the waveform changes at the cycle of discharge.

Figure 4:
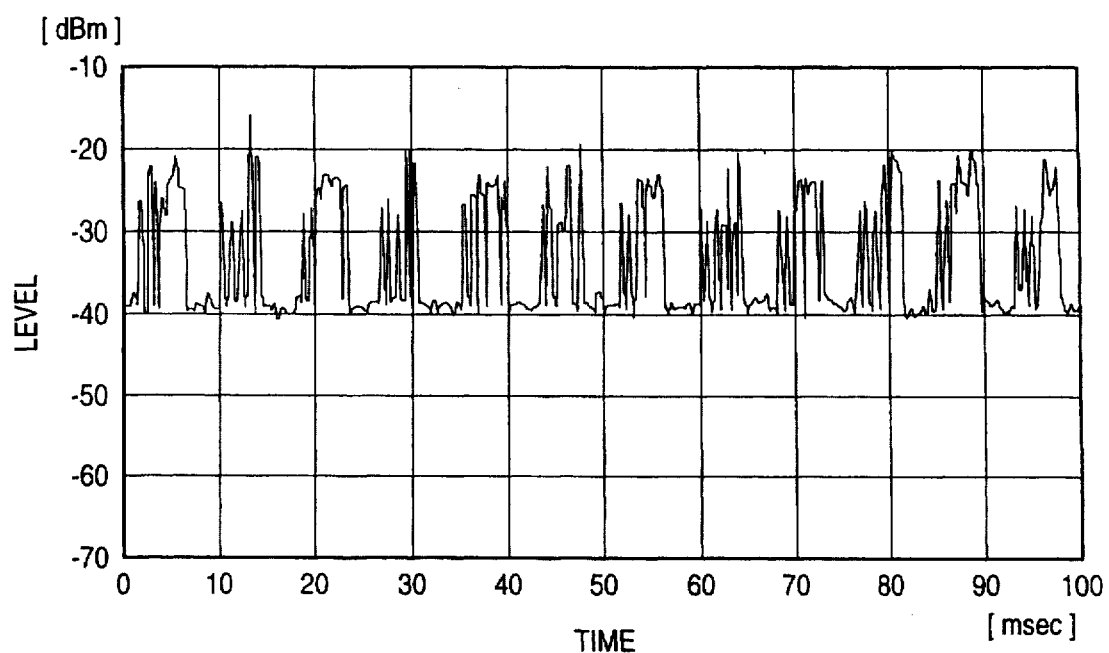
FIG. 4 is a measured drawing showing variations in the strength of an electromagnetic waveform with time measured at a frequency of 30 MHz when a partial discharge changing at the frequency twice that of a system power supply develops in the signal received by the antenna shown in FIG. 2.

In the event of partial discharge developing in both the positive and negative electrodes of system voltage, a resultant electromagnetic waveform changes in magnitude at the frequency which is twice that of system power supply as shown in, e.g., FIG. 4. In the event of partial discharge developing in only the positive or negative electrode of system voltage, the electromagnetic waveform changes in magnitude at the frequency of system power supply as shown in, e.g., FIG. 5.

Figure 5:
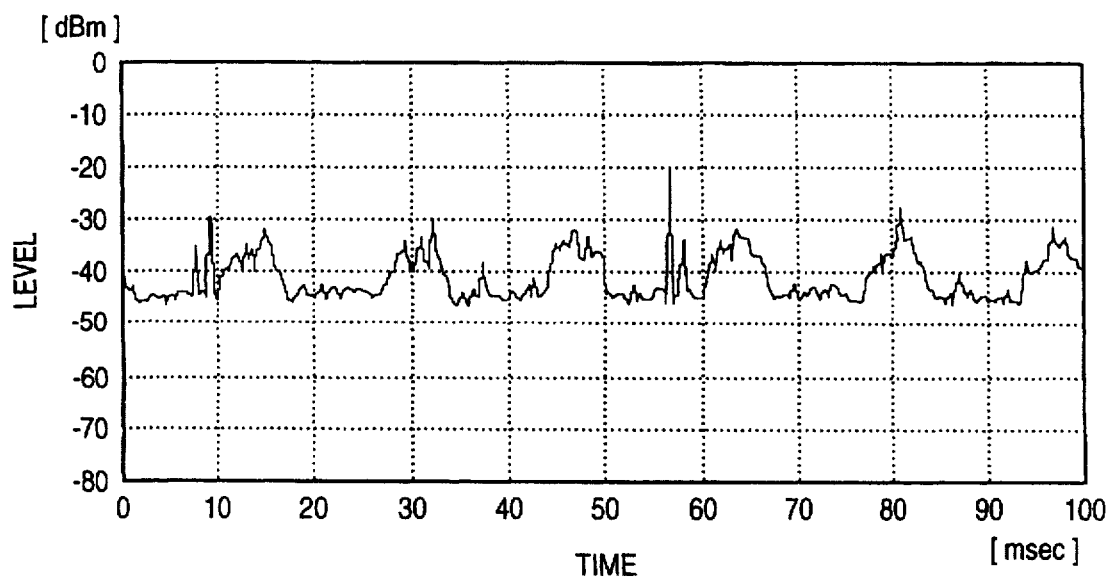
FIG. 5 is a measured drawing showing variations in the strength of an electromagnetic waveform with time measured at a frequency of 30 MHz when a partial discharge changing at the frequency of the system power supply develops in the signal received by the antenna shown in FIG. 2.

FIGS. 4 and 5 show variations in the strength of an electromagnetic waveform with respect to time when a system power supply is 60 Hz and where the signal received by the antenna 1 has a measurement frequency of 30 MHz. In FIG. 4, the strength changes at a frequency of 120 Hz (=60 Hz×2), whereas in FIG. 5 the strength changes at a frequency of 60 Hz.

In the environment where discharge develops, the magnitude of the component changing at a frequency of 120 Hz or 60 Hz differs according to the frequency of the electromagnetic waveform. Accordingly, the frequency at which the component becomes sufficiently large is determined as a measurement frequency.

More specifically, an appropriate measurement frequency is selected from test data or field data beforehand, and the thus-selected frequency is set in the computer 4. On a display screen 6 of the computer 4 are displayed a graph relating to the frequency characteristics of background noise denote by solid line (1) shown in FIG. 3 measured beforehand and a graph related to the most current frequency characteristics denoted by a solid line (2) shown in FIG. 3. By way of the operator's operations, there is selected a frequency at which a level difference between the solid lines (1), (2) is large and where the electromagnetic waveform generated by partial discharge is less affected by background noise. The thus-selected frequency is set as a measurement frequency and is set in the computer 4 by way of operations of the keyboard 7.

Steps A1 to A8 shown in FIG. 1 illustrate the procedures for detecting discharge through use of the system shown in FIG. 2. In step A1, a suitable measurement frequency is set in the manner as mentioned previously before or after arrival of the vehicle at a measurement location.

Actual measurement and detection are commenced, and the measurement operations of the spectrum analyzer 3 (i.e., time-domian measurement) are controlled by means of the computer 4, as denoted by step A2. A component of measurement frequency included in the signal received by the antenna 1 is measured for an appropriately-set period of time.

As shown in, e.g., FIGS. 4 and 5, data regarding the result of such measurement represent a waveform in which a component having a frequency twice that of system power supply (i.e., 120 Hz) or a component having a frequency of system power supply (i.e., 60 Hz) is superimposed on background noise along the time axis.

On the display screen 6 of the computer 4 is displayed a graph regarding the characteristics of a measurement waveform shown in FIGS. 4 and 5, for example. Then, an operator can make determination as to whether or not partial discharge develops. Further, if a check is made as to whether or not partial discharge develops in pole-type equipment provided on a plurality of electric poles, automatic detection is desirable in terms of processing time and labor.

The data regarding the measured waveform obtained from the spectrum analyzer 3 are subjected to FFT analysis in step A3 by means of the computer 4.

In the first embodiment, partial discharge is detected from the component which changes at the frequency of system power supply in the received electromagnetic waveform of measurement frequency which detection cannot have been conventionally effected. Accordingly, a component changing at the frequency of system power supply, e.g., at a frequency of 60 Hz, is extracted through FFT analysis from the signal of measurement frequency received by the antenna 1.

To determine presence or absence of discharge from the magnitude of the extracted component, more specifically, an effective value of the component, the component (i.e., the effective value) extracted in steps A4 and A5 shown in FIG.

1 is compared with a preset threshold value, thereby determining the presence or absence of discharge.

If the extract component is larger than the threshold value, discharge is determined to exist in step A6, and partial discharge is detected.

In contrast, if the extract component is lower than the threshold value, discharge is determined not to exist in step A7.

In a case where the received electromagnetic waveform of measurement frequency is changed at the frequency of system power supply by partial discharge, a threshold value corresponding to the extracted component changing at the frequency of system power supply is set. Accordingly, there are prevented detection failures, which would otherwise be caused when a decision is made on the basis of the threshold value corresponding to the component changing at the frequency twice that of system power supply. Further, partial discharge can be automatically detected from the magnitude of the extracted component.

When partial discharge is detected, in step A8 the computer 4 gives an alarm about insulation failure. Further, the result of determination is displayed on the display screen 6, thus assisting in operator's manual acknowledgment and decision.

(Second Embodiment)

A second embodiment will now be described by reference to FIG. 6.

The second embodiment is different from the first embodiment in that the computer 4 shown in FIG. 2 determines the presence or absence of discharge from a strength ratio of the extracted component to background noise, thus enabling detection of partial discharge.

Figure 6:
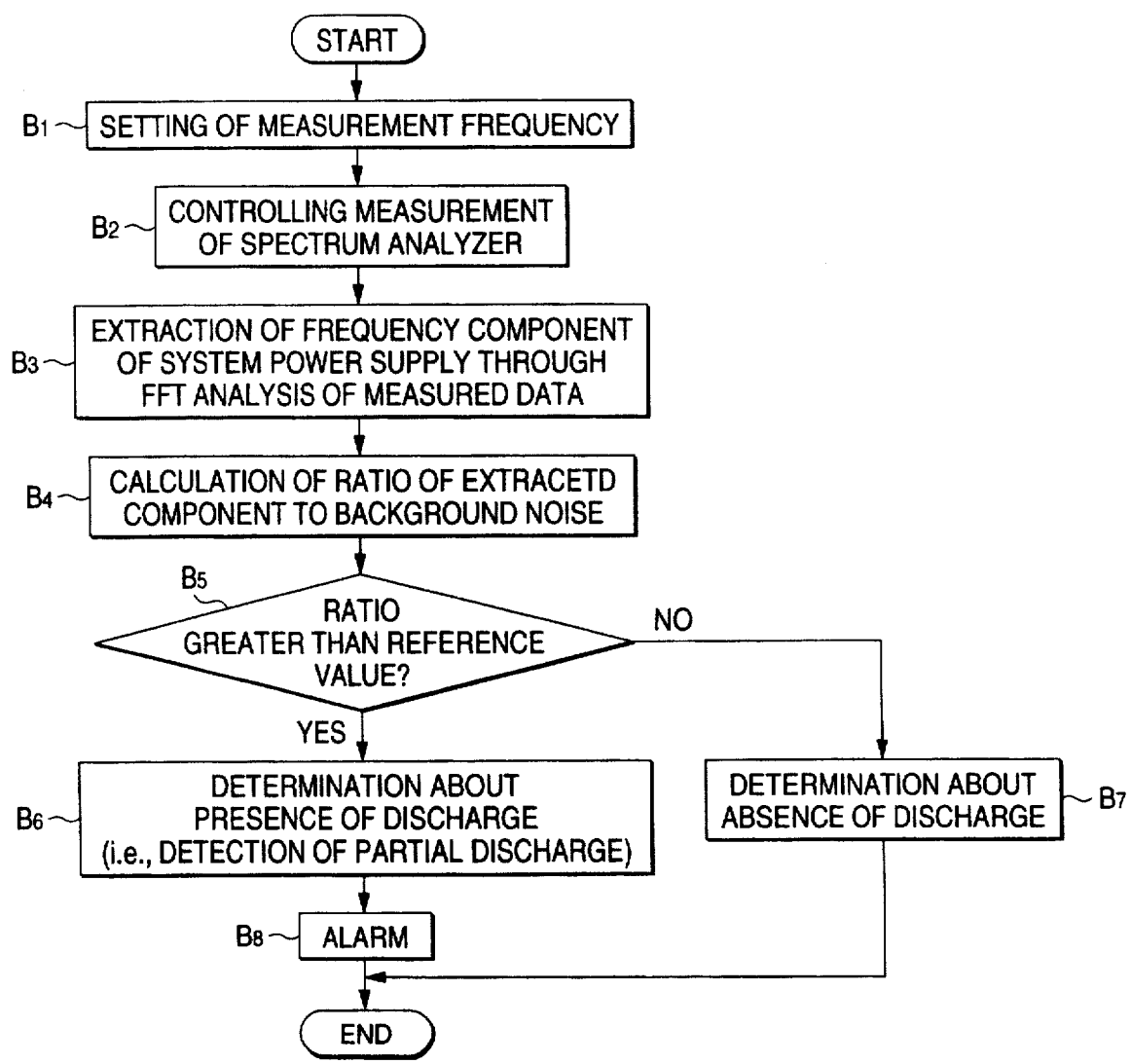
FIG. 6 is a flowchart for describing detection processing according to a second embodiment of the present invention.

The computer 4 operates according to the procedures provided in steps B1 to B6 shown in FIG. 6, and the processing analogous to that performed in steps A1 to A3 shown in FIG. 1 is performed in steps B1 to B3. Through FFT analysis of the measurement data obtained by the spectrum analyzer 3, a component changing at the frequency of system power supply is extracted from the signal of measurement frequency received by the antenna 1.

In step B4, the computer 4 averages the measurement data by elimination of, e.g., large values, thereby obtaining background noise. A strength ratio of background noise by the extracted component, more specifically a ration of effective values, is calculated.

In steps B5 to B7, the computer 4 compares the thus-obtained ratio with an appropriate preset threshold value. In a case where the obtained ratio is greater than the threshold value, discharge is determined to exist. In contrast, in a case where the ratio is smaller than the threshold value, discharge is determined not to exist.

When partial discharge is detected, an alarm is given in step B8 in the same manner as in steps A8 shown in FIG. 1.

Accordingly, in the second embodiment, partial discharge can be detected by obtaining a strength ratio of the extracted component to background noise.

(Third Embodiment)

A third embodiment will be described by reference to FIG. 7.

In the third embodiment, more accurate detection of partial discharge is effected by combination of the detection methods according to the first and second embodiments.

Figure 7:
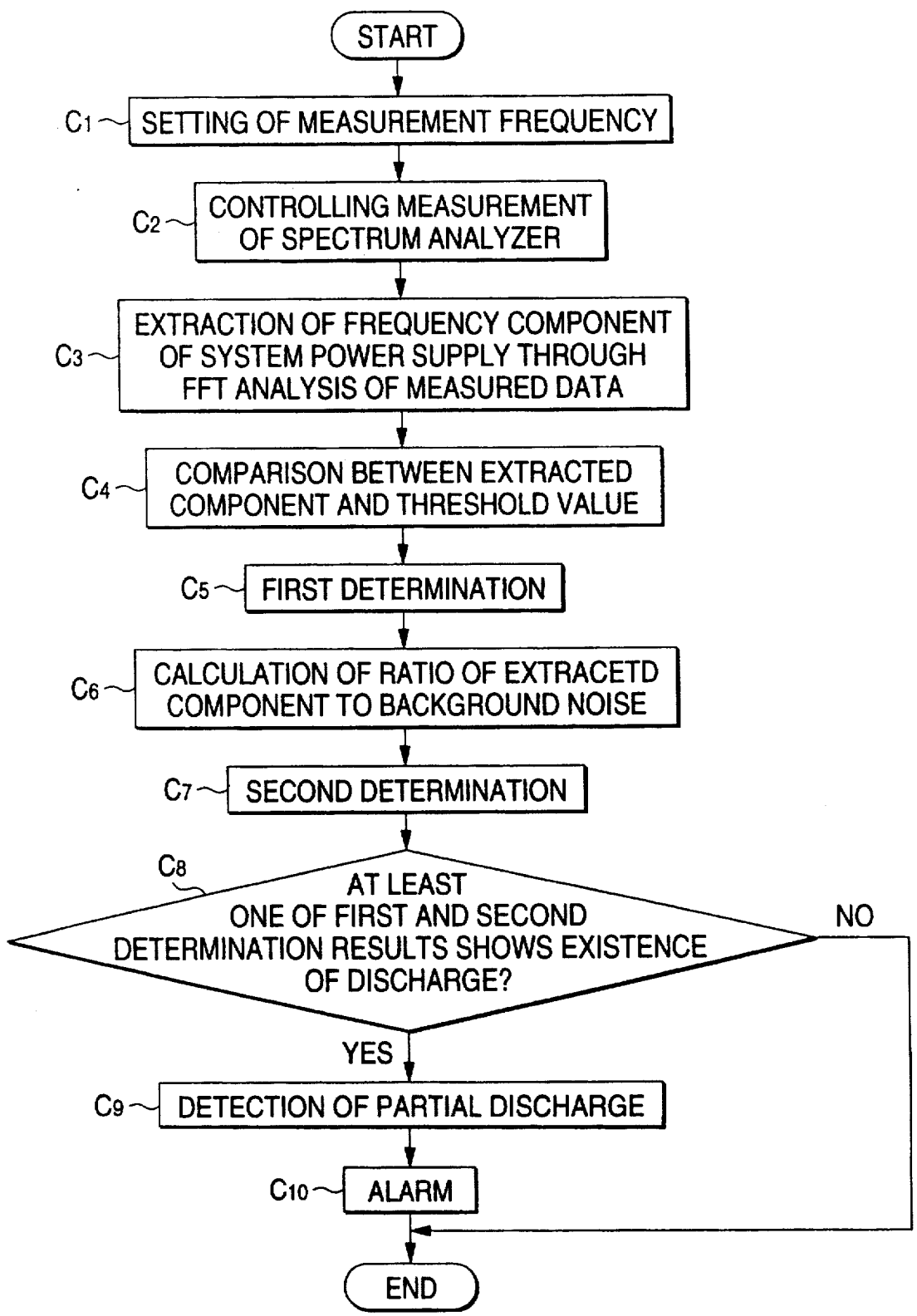
FIG. 7 is a flowchart for describing detection processing according to a third embodiment of the present invention.

The computer 4 operates according to the procedures C1 through C10 shown in FIG. 7. Processing analogous to that performed in steps A1 through A4 shown in FIG. 1 is performed in steps C1 through C4. Through FFT analysis, a component changing at the frequency of system power supply is extracted from the signal of measurement frequency received by the antenna 1. The thus-extracted component is compared with a threshold value, thereby determining the presence or absence of discharge. The result of such determination is retained in step C5 as the result of first determination.

Processing analogous to that performed in steps B4 and B5 shown in FIG. 6 is performed in step C6, thereby obtaining a strength ratio of the extracted component to background noise. The ratio is compared with a reference value to thereby determine the presence or absence of discharge, and the result of such determination is retained in step C7 as the result of second determination.

In steps C8 and C9, partial discharge is detected when at least one of the first and second determination results represents existence of discharge, and the alarm operations which are the same as those performed in step A8 shown in FIG. 1 and in step B8 shown in FIG. 2 are performed in step C10.

Accordingly, in the third embodiment, the determination based on the magnitude of an extracted component and the determination based on a strength ratio of an extracted component to background noise are used in conjunction with each other. If discharge is determined to exist from either of determination results, partial discharge is detected, thereby giving an alarm. In this way, partial discharge is more accurately and without fail detected from the component changing at the frequency of system power supply.

(Fourth Embodiment)

A fourth embodiment will be described by reference to FIG. 8.

In the fourth embodiment, even if the received electromagnetic waveform of measurement frequency includes a component which changes at the frequency of system power supply because of partial discharge or a component which changes at the frequency twice that of system power supply because of partial discharge, partial discharge is detected. To this end, the computer 4 shown in FIG. 2 operates according to the procedures of steps D1 through D9 shown in FIG. 8.

Processing similar to that performed in steps A1 and A2 shown in FIG. 1 is performed in steps D1 and D2, thereby collecting waveform data regarding the result of the analysis performed by the spectrum analyzer shown in FIG. 2.

In step D3, the waveform data produced by the spectrum analyzer 3 are subjected to FFT analysis, thereby extracting, from the signal of measurement frequency received by the antenna 1 and separately from each other, a first component changing at the frequency of system power supply and a second component changing at the frequency which is twice that of the frequency of system power supply.

In step D5, the first component is compared with a preset first threshold value to thereby determine the presence or absence of discharge. In step D6, the second component is compared with preset second threshold value to thereby determine the presence or absence of discharge.

At this time, if either the first component or second component becomes greater than its corresponding threshold value i.e., if the determination result made in either step D5 or D6 shows existence of discharge, partial discharge in detected in step D7.

The computer 4 gives an alarm about insulation failures through execution of the alarm processing in step D8, and the result of such decision is indicated on the display screen 6, thereby assisting in the operator's manual acknowledgment and determination.

When the first and second components are lower than the corresponding threshold values i.e., if the determination result made in steps D5 and D6 fail to show existence of discharge, discharge is determined not to exist in step D9. The processing is now completed.

Accordingly, in the fourth embodiment, even if the received electromagnetic waveform of measurement frequency is changed at the frequency of system power supply or at the frequency twice that of system power supply because of partial discharge, threshold values corresponding to variable components of respective frequencies are set, thus enabling reliable detection of partial discharge.

(Fifth Embodiment)

A fifth embodiment will be described by reference to FIG. 9.

Figure 8:
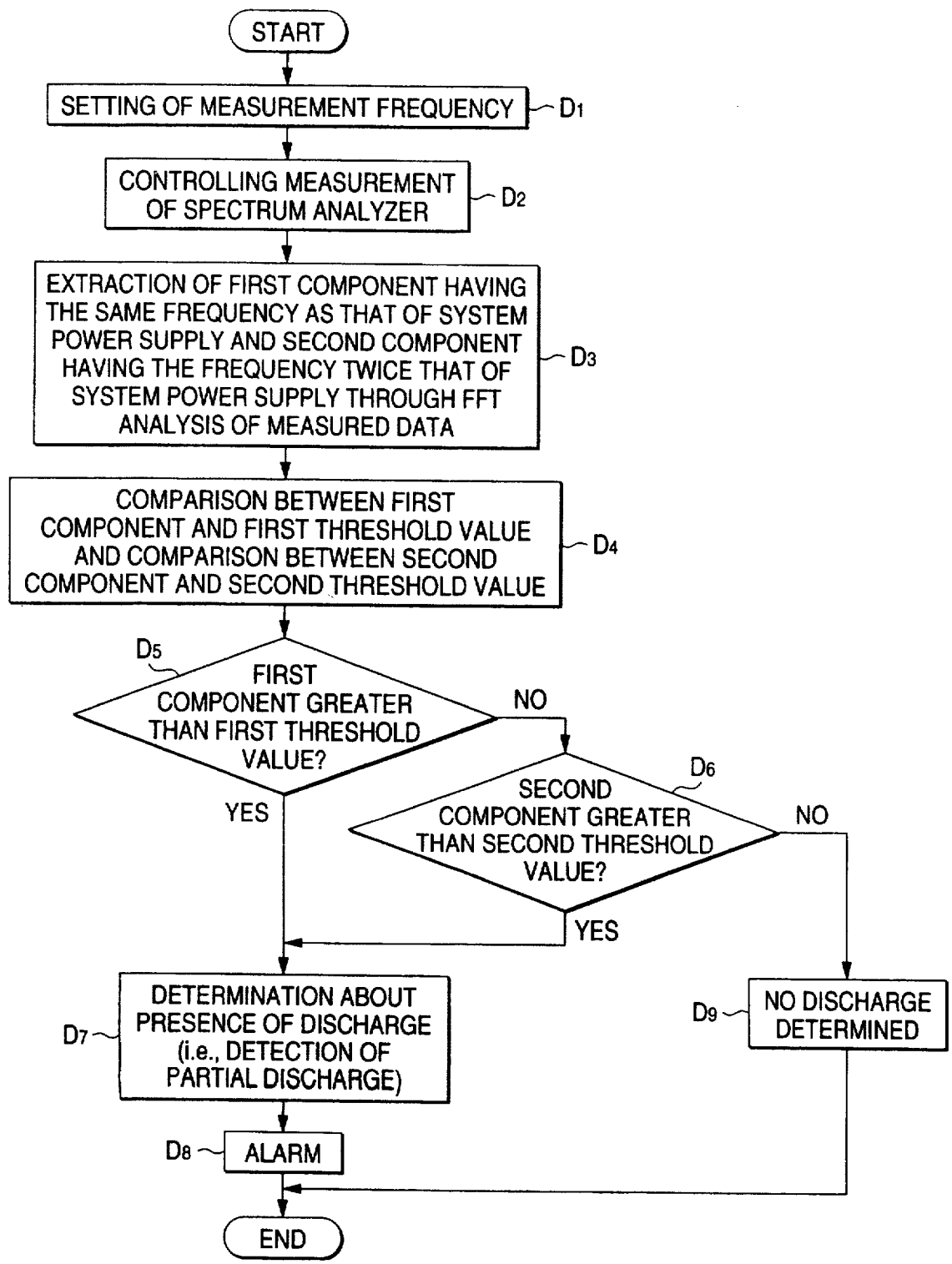
FIG. 8 is a flowchart for describing detection processing according to a fourth embodiment of the present invention.
Figure 9:
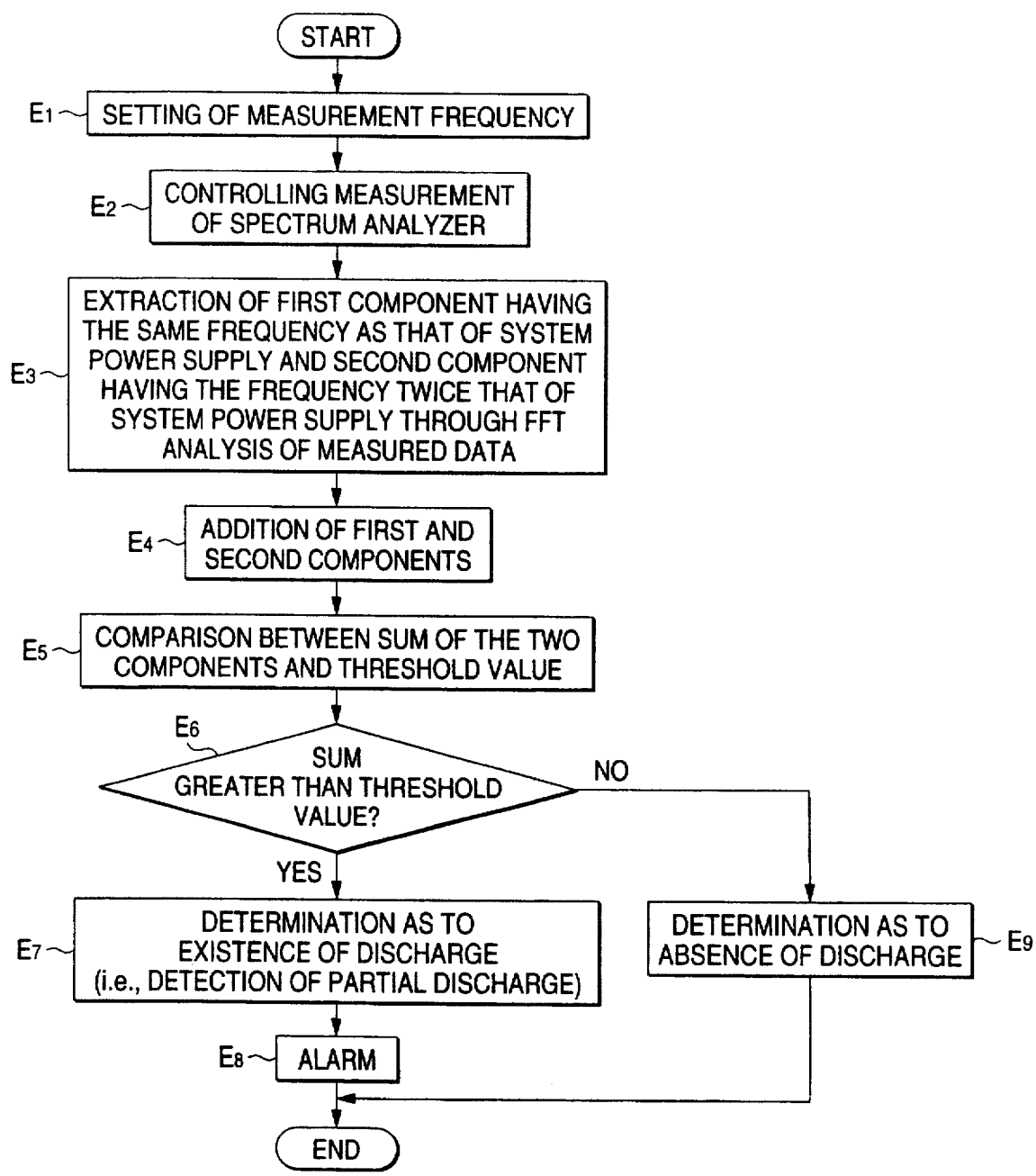
FIG. 9 is a flowchart for describing detection processing according to a fifth embodiment of the present invention.

In the fifth embodiment, the computer 4 shown in FIG. 2 operates according to steps E1 through E9 shown in FIG. 9. Processing similar to that performed in steps D1 to D3 shown in FIG. 8 is performed in steps E1 through E3. A first component changing at the frequency of system power supply and a second component changing at the frequency twice that of system power supply are extracted from the signal of measurement frequency received by the antenna 1.

In step E4, the first and second components are added together, and the sum of the components is compared with a preset threshold value in step E5.

When either the first component or the second component becomes greater than the other because of partial discharge, the sum of the components becomes greater than the threshold value. In step E7, partial discharge is detected on the basis of the result of determination; that is, the existence of discharge. On the basis of the result of such detection, alarm processing similar to that performed in step D8 shown in FIG. 8 is executed in step E8.

In the event of no partial discharge developing, the sum of the first and second components becomes smaller than the threshold value, and discharge is determined not to exist in step E9. The processing is now completed.

Consequently, in the fifth embodiment, partial discharge can be detected without fail from the sum of the first component changing at the frequency of system power supply and the second component changing at the frequency twice that of system power supply, both of which are included in the received electromagnetic waveform of measurement frequency.

(Sixth Embodiment)

A sixth embodiment will now be described by reference to FIG. 10.

Figure 10:
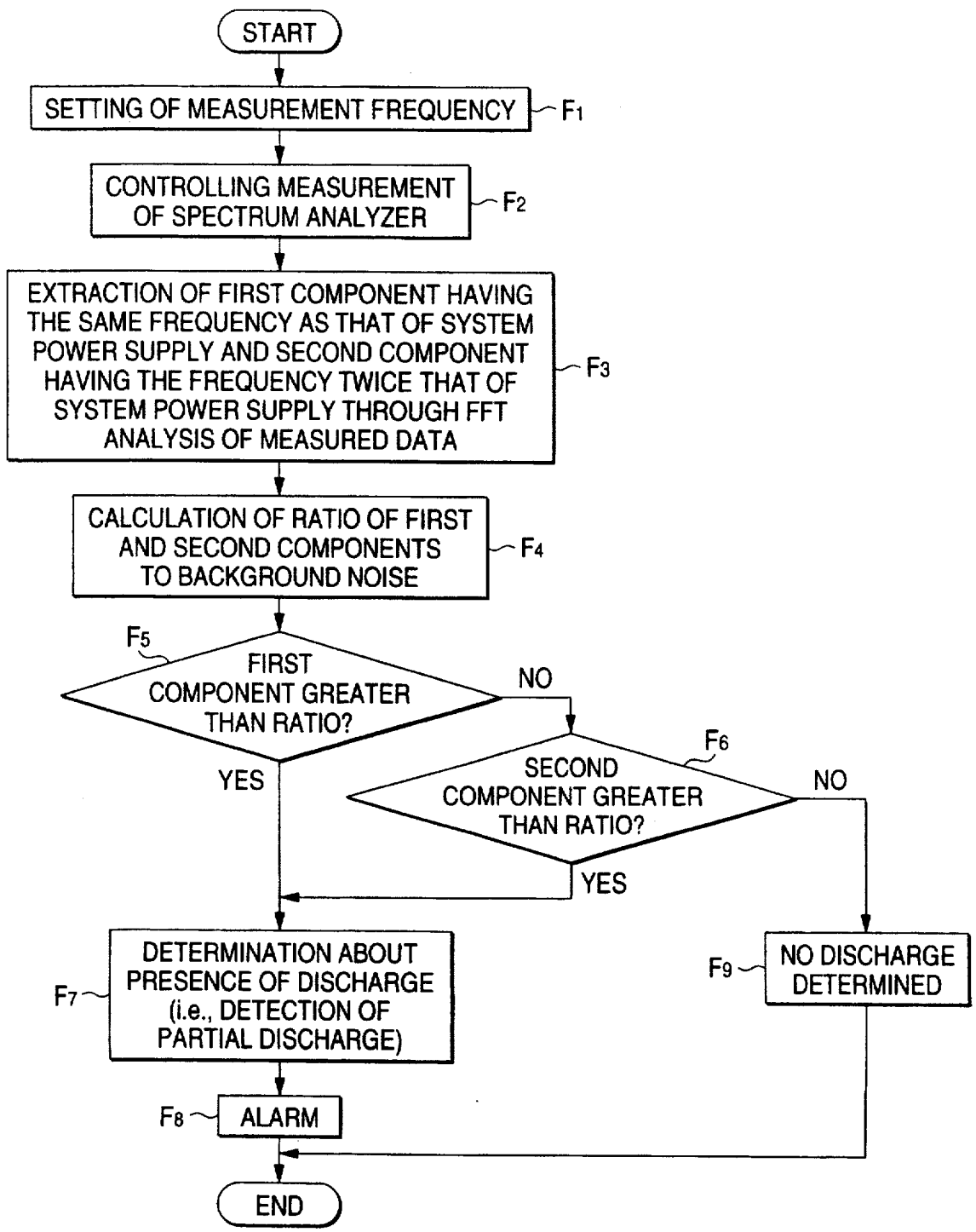
FIG. 10 is a flowchart for describing detection processing according to a sixth embodiment of the present invention.

In the sixth embodiment, the computer 4 shown in FIG. 2 operates according to steps F1 through F9 shown in FIG. 10, and processing analogous to that performed in steps D1 through D3 is performed in steps F1 through F3, whereby first and second components are extracted.

In step F4, for example, a strength ratio of the first component to background noise and a strength ratio of the second component to background noise are obtained in the same manner as in step B4 shown in FIG. 6. In steps F5 and F6, the strength ratio related to the first component is compared with the reference value, and the strength ratio related to the second component is compared with the reference value in the same manner as in step B5 shown in FIG. 6, thereby determining the presence or absence of discharge.

If the determination result made in either step F5 or F6 shows existence of discharge, partial discharge is detected in step F7, and alarm processing similar that performed in step D8 shown in FIG. 8 is performed in step F8.

In contrast, if the determination results made in steps F5 and F6 fail to show existence of discharge, discharge is determined not to exist in step F9. Hence, the processing is now completed.

(Seventh Embodiment)

A seventh embodiment will now be described by reference to FIG. 11.

Figure 11:
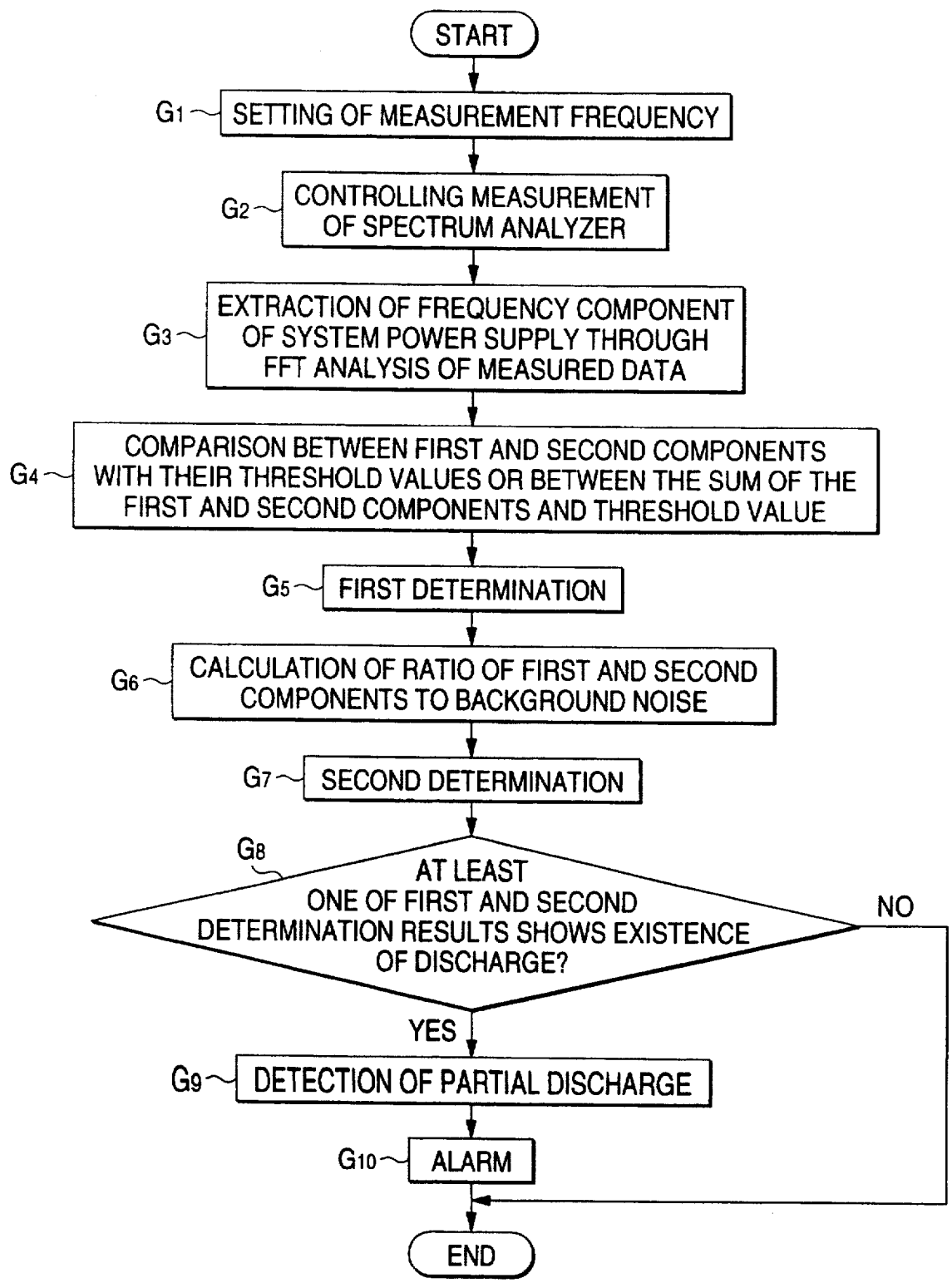
FIG. 11 is a flowchart for describing detection processing according to a seventh embodiment of the present invention.

In the seventh embodiment, in order to detect partial discharge through use of the detection procedures referred to in the fourth or fifth embodiment and the detection procedures referred to in the sixth embodiment in combination, the computer 4 shown in FIG. 2 operates according to procedures G1 to G10 shown in FIG. 11. For example, in steps G1 through G3, processing similar to that performed in steps F1 through F3 shown in FIG. 10 is performed, thereby extracting first and second components from an electromagnetic waveform of measurement frequency.

By the first determination method performed in steps G4 and G5, there is performed processing similar to that performed in steps D4 to D7 and D9 shown in FIG. 8 or to that performed in steps E4 to E7 and E9 shown in FIG. 9. By the second determination method performed in steps G6 and G7, there is performed processing similar to that performed in steps F4 to F7 and F9 shown in FIG. 10, thereby making a decision as to whether or not there is discharge, from the strength ratios of the first and second components to background noise.

In steps G8 and G9, if at least either the first determination results made in step G5 or the second determination results made in step G6 shows existence of discharge, partial discharge is detected. In step G10, for example, alarm processing similar to that performed in step F8 shown in FIG. 10 is performed.

Accordingly, in the seventh embodiment, two types of detection methods are used in combination, and even when the electromagnetic waveform of measurement frequency changes in magnitude either at the frequency of system power supply or at the frequency twice that of system power supply, partial discharge can be detected with considerable high accuracy.

Under the partial discharge detection method, electromagnetic energy is actually measured. Specifically, the magnitude of each of the extracted component, the first component "a," and the second component "b" obtained in the respective embodiments is an effective value. The sum employed in the fifth and seventh embodiments corresponds to a sum of effective values of the first and second components "a" and "b," i.e.,‰($a^2+b^2$).

In respective embodiments, the band of measurement frequency (i.e., a tuning frequency) is desirably set to as narrow range as possible in order to increase the accuracy of detection by elimination of unnecessary noise.

When the band of measurement frequency is made narrow, in some cases the system is brought out of tune, thereby resulting in failure to extract a component of partial discharge from the signal received by the antenna one shown in FIG. 2.

When partial discharge is detected with high accuracy by making the band of measurement frequency as narrowly as possible, a plurality of appropriate frequencies are selected as measurement frequencies from test data or frequency spectrum data. Required frequency components with regard to these frequencies are extracted beforehand, and partial discharge is experimentally detected by means of the computer 4. Preferably, as a result of such detection, the most suitable frequency is determined as a measurement frequency.

When detection is carried out with regard to a plurality of measurement frequencies, the signal received by the antenna 1 is distributed to a plurality of spectrum analyzers 3. The measurement data of each analyzer 3 are fed to the computer 4, and partial discharge is detected through parallel processing, such as what is called time-division parallel processing.

Next, in terms of elimination of unwanted noise, the antenna 1 is preferably a directive antenna. For example, when a plurality of pole-type devices provided along a distribution line are detected one after another while the system is moved by means of a car, it is desirable to eliminate a limitation on the receiving position by increasing a receiving range, which has an effect of shortening of working hours. In practice, checking of discharge within a short period of time is considerably important, and hence a non-directive antenna is preferably used as the antenna 1.

In each of the previous embodiments, the component of measurement frequency is extracted through FFT analysis through use of the spectrum analyzer 3 and the computer 4. However, the component may be extracted through use of another frequency analytical method such as DFT analysis or through use of a hardware circuit such as a filter circuit.

As a matter of course, the present invention can be applied to detection of partial discharge of any of various types of electric devices.

The present invention yields the following advantageous results:

According to the first aspect of the present invention, an electromagnetic waveform of measurement frequency is produced by a partial discharge in synchronism with a system power supply. In a case where the electromagnetic waveform changes in magnitude according to the frequency of the system power supply, a component having the same frequency as that of the system power supply is extracted from the electromagnetic waveform of the signal received by an antenna 1. Taking the thus-extracted component as a component having the frequency of the system power supply, a partial discharge is detected from the magnitude of the component. Accordingly, in a case where a received electromagnetic waveform of measurement frequency is changed by the partial discharge according to the frequency of the system power supply, the partial discharge can be detected without involvement of detection failures.

According to the second aspect of the present invention, in a case where background noise, such as broadcast waveforms, is included in a received electromagnetic waveform, a component changing at the frequency of the system power supply can be extracted from the electromagnetic waveform of measurement frequency by elimination of background noise through calculation of a strength ratio of the signal received by the antenna 1 to background noise. In a case where a received electromagnetic waveform of measurement frequency changes according to the frequency of the system power supply, a partial discharge can be detected by elimination of influence of background noise without involvement of detection failures.

According to the third aspect of the present invention, the presence or absence is determined from the magnitude of a component changing at the frequency of the system power supply included in the received electromagnetic waveform of measurement frequency, and the presence or absence of discharge is determined from a ratio of the component to background noise. If at least one of the determination results shows presence of discharge, a partial discharge is detected. Therefore, by means of the detection method defined in the first and second aspects, a partial discharge can be detected more reliably from a component which has the same frequency as that of the system power supply and which is included in the electromagnetic waveform of measurement frequency.

According to the fourth aspect of the present invention, not only in a case where a received electromagnetic waveform of measurement frequency is changed by a partial discharge according to the frequency of the system power supply but in a case where the electromagnetic waveform is changed at the frequency twice that of the system power supply, a partial discharge can be reliably detected from the magnitude of the respective frequency components.

According to the fifth aspect of the present invention, in a case where a received electromagnetic waveform of measurement frequency is changed by a partial discharge according to the frequency of the system power supply and where the electromagnetic waveform is changed at the frequency twice that of the system power supply, a partial discharge can be reliably detected from the sum of extracted components of the two frequencies.

According to the sixth aspect of the present invention, in a case where a received electromagnetic waveform of measurement frequency is changed by a partial discharge according to the frequency of the system power supply and where the electromagnetic waveform is changed at the frequency twice that of the system power supply, a partial discharge can be reliably detected from a strength ratio of one component to the background noise of the received signal or from a strength ratio of another component to the background noise.

According to the seventh aspect of the present invention, in a case where a received electromagnetic waveform of measurement frequency is changed by a partial discharge according to the frequency of the system power supply and where the electromagnetic waveform is changed at the frequency twice that of the system power supply, through use of the detection method defined in the fourth and fifth aspects and the detection method defined in claim 6 in combination, a partial discharge can be detected with a considerably high degree of accuracy from the magnitude of the extracted component and from a ratio of the extracted component to background noise.

In practice, according to the present invention, a partial discharge is actually detected from electromagnetic energy, and hence the extracted component or the first and second components referred to in the first to seventh aspects can be more realistically expected to assume an effective value or values.

What is claimed is:

1. A partial discharge detection method comprising the steps of:

receiving an electromagnetic signal generated by at least one piece of electric equipment, determining a measurement frequency of the signal to diminish the frequency characteristics of background noise;

extracting a component of the measurement frequency modulating at the frequency of a system power supply of the electric equipment; and detecting a partial discharge based on the extracted component.

2. A partial discharge detection method according to claim 1, wherein the signal is received by an antenna.

3. A partial discharge detection method according to claim 1, wherein the partial discharge is detected based on a magnitude of the extracted component.

4. A partial discharge detection method according to claim 1, wherein the partial discharge is detected based on a strength ratio of the extracted component to the background noise of the signal.

5. A partial discharge detection method according to claim 1, wherein the step of detecting the partial discharge further comprises:

measuring a magnitude of the extracted component; and measuring a strength ratio of the extracted component to the background noise of the signal, wherein the partial discharge is detected when either the magnitude of the extracted component is greater than a first threshold value or the strength ratio of the extracted component is greater than a second threshold value.

6. A partial discharge detection method according to claim 1, wherein the extracted component is an effective value of electromagnetic energy.

7. A partial discharge detection method comprising the steps of:

receiving an electromagnetic signal generated by at least one piece of electric equipment;

determining a measurement frequency of the signal to diminish the frequency characteristics of background noise;

extracting a first component of the measurement frequency, wherein the first component is modulating at the frequency of a system power supply of the electric equipment;

extracting a second component of the measurement frequency, wherein the second component is modulating at twice the frequency of the system power supply; and detecting a partial discharge based on the extracted components.

8. A partial discharge detection method according to claim 7, further comprising measuring a magnitude of the first and second components, wherein a partial discharge is detected when either the first component is greater than a first threshold value of the second component is greater than a second threshold value.

9. A partial discharge detection method according to claim 7, wherein the partial discharge is detected from the sum of the first and second components.

10. A partial discharge detection method according to claim 7, further comprising:

determining a strength ratio of the first component to the background noise of the signal; and determining a strength ratio of the second component to the background noise of the signal, wherein the partial discharge is detected when either the strength ratio of the first component is greater than a third threshold value or the strength ratio of the second component is greater than a fourth threshold value.

11. A partial discharge detection method according to claim 7, further comprising:

determining a magnitude of the first component;

determining a magnitude of the second component;

determining a sum of the magnitudes of the first and second components;

determining a strength ratio of the first component to the background noise of the signal;

determining a strength ration of the second component to the background noise of the signal; and determining a strength ratio of the sum of the first and second components to the background noise of the signal wherein the partial discharge is detected when any of the magnitudes or strength ratios is determined to be greater than its respective threshold value.

12. A partial discharge detection method according to claim 7, wherein the extracted component of the first and second components are effective values of electromagnetic energy.

* * * * *